United States Patent [19]
Horie

[11] Patent Number: 5,406,113
[45] Date of Patent: Apr. 11, 1995

[54] BIPOLAR TRANSISTOR HAVING A BURIED COLLECTOR LAYER

[75] Inventor: Hiroshi Horie, Kawasaki, Japan

[73] Assignee: Fujitsu Limited, Kawasaki, Japan

[21] Appl. No.: 136,593

[22] Filed: Oct. 14, 1993

Related U.S. Application Data

[63] Continuation of Ser. No. 817,085, Jan. 6, 1992, abandoned.

[30] Foreign Application Priority Data

Jan. 9, 1991 [JP] Japan .................................. 3-001124
Jan. 9, 1991 [JP] Japan .................................. 3-001125

[51] Int. Cl.⁶ ..................... H01L 29/72; H01L 27/02; H01L 29/04; H01L 29/12
[52] U.S. Cl. ................................. 257/565; 257/505; 257/520; 257/576; 257/587; 257/588
[58] Field of Search .................. 357/34, 35, 47, 55, 357/59, 43, 44; 257/513, 518, 519, 520, 503, 508, 524, 517, 586, 505, 515, 516, 555, 565, 576, 587, 588, 506

[56] References Cited

U.S. PATENT DOCUMENTS 3,648,128 3/1972 Kobayashi ........................... 257/555
4,660,068 4/1987 Sakuma et al. ...................... 257/506
4,889,823 12/1989 Bertagnolli et al. .................. 357/34

FOREIGN PATENT DOCUMENTS 2-133928 8/1990 Japan .
2-207534 8/1990 Japan .

OTHER PUBLICATIONS

Gotou et al., "Soi-Device on Bonded Wafer", Fujitsu Sci. Tech. J., 24,4, pp. 408–417, Dec. 1988.

Primary Examiner—Andrew J. James
Assistant Examiner—Carl Whitehead, Jr.
Attorney, Agent, or Firm—Staas & Halsey

[57] ABSTRACT

A bipolar transistor includes a substrate, an insulating layer formed on the substrate, and a semiconductor layer having a bottom surface and side surfaces surrounded by the insulating layer. The semiconductor layer includes a collector region formed in a first surface portion of the semiconductor layer, and a collector lead region having a concentration higher than that of the collector region. The collector read region includes a silicon single crystal layer formed in a second surface portion of the semiconductor layer, and a polysilicon layer having side surfaces surrounded by the silicon single crystal layer. A base region is formed on the collector region, and an emitter region is formed in the base region.

26 Claims, 10 Drawing Sheets

BIPOLAR TRANSISTOR HAVING A BURIED COLLECTOR LAYER

This application is a continuation of application Ser. No. 07/817,085, filed Jan. 6, 1992, now abandoned.

BACKGROUND OF THE INVENTION (1) Field of the Invention

The present invention generally relates to bipolar transistors, and more particularly to improvements in a layer structure having a buried collector. Further, the present invention is concerned with a method of fabricating such a bipolar transistor.

(2) Description of the Prior Art

Most large-scale integrated circuits use silicon. Silicon bipolar transistors are known as high-speed transistors.

FIG. 1 is a cross-sectional view of a conventional silicon bipolar transistor. An n+-type buried layer 52 is formed in a p-type silicon substrate 50. An n−-type silicon collector layer 54 is epitaxially grown on the n+-type buried layer 52 and the p-type silicon substrate 50. Although not shown in FIG. 1, a p+-type element isolation region is formed on the side of the n−-type collector layer 54, and hence the n−-type collector layer 54 is isolated from other transistors by a pn junction. A field oxide film 56 is selectively formed on the n−-type collector layer 54. Then, n-type impurities are added to the n−-type collector layer 54, which is separated from the other transistors by the field oxide film 56. Then, an n+-type collector lead area 58 is formed so that it comes into contact with the n+-type buried layer 52. During this process, n-type impurities are diffused into and thereby, to form, the n+-type collector lead area 58.

Silicon is epitaxially grown on the entire surface, and thereby a p-type base region 60 and a base lead region 62 are formed at the same time as each other. The p-type base region 60 made of a p-type silicon single crystal is formed on the n−-type collector layer 54. The base lead region 62 made of polysilicon is formed on the field oxide film 56. Then, the base lead region 62 is patterned into a predetermined shape, and a silicon oxide film 64 is formed on the entire surface.

Thereafter, contact windows are formed in the silicon oxide film 64 formed on the p-type base region 60. One of the contact windows is then filled with an emitter lead electrode 66 formed with a polysilicon layer with n-type impurities added thereto. An n+-type emitter region 68 is formed in a surface portion of the p-type base region 60 by a solid phase diffusion process in which impurities are derived from the emitter lead electrode 66. A base electrode 70 formed of aluminum is formed so that it is in contact with the base lead region 62 via the corresponding contact window. A collector electrode 72 formed of aluminum is formed so that it is in contact with the collector lead region 58 via the corresponding contact window.

In order to configure a circuit using bipolar transistors as described above, it is necessary to decrease parasitic capacitances coupled to nodes or terminals of the circuit. In the layer structure shown in FIG. 1, the n−-type collector layer 54 is isolated from the p+-type element isolation region (not shown) by the pn junction, and a bottom surface portion of the n+-type buried layer 52 is connected to the p-type silicon substrate by the pn junction. These pn junctions for isolation form large parasitic capacitors and prevent a high-speed operation of the circuit.

In order to overcome the above disadvantage and improve element isolation, it has been proposed that a thick oxide film formed by a LOCOS (Local Oxidation of Silicon) process or a U-shaped or V-shaped trench isolation be used instead of the pn-junction-based isolation. However, even with the above improvements, it is impossible to reduce to a negligible value the parasitic capacitance between the collector and the substrate, particularly at the bottom surface of the n+-type buried layer 52 and the p-type silicon layer 50. Hence, a circuit based on the above-mentioned improvements does not operate at a high speed.

SUMMARY OF THE INVENTION

It is a general object of the present invention to provide a bipolar transistor in which the above-mentioned disadvantages are eliminated.

A more specific object of the present invention is to extremely reduce the parasitic capacitance formed between the collector and the substrate.

The above objects of the present invention are achieved by a bipolar transistor comprising: a substrate; an insulating layer formed on the substrate; a semiconductor layer having a bottom surface and side surfaces surrounded by the insulating layer, the semiconductor layer comprising a collector region formed in a first surface portion of the semiconductor layer, and a collector lead region having a concentration higher than that of the collector region, the collector lead region comprising a silicon single crystal layer formed in a second surface portion of the semiconductor layer, and a polysilicon layer having side surfaces surrounded by the silicon single crystal layer; and a base region formed on the collector region; and an emitter region formed in the base region.

Another object of the present invention is to provide a method of producing the above-mentioned bipolar transistor.

This object of the present invention is achieved by a method of producing a bipolar transistor comprising the steps of: forming a first insulating layer on a first substrate; forming an opening in the first insulating layer; epitaxially growing silicon so that a silicon single crystal layer is formed on the first substrate and a polysilicon layer is formed on main and side surfaces of the first insulating layer; introducing impurities into surface portions of the polysilicon layer and the silicon single crystal layer; forming a second insulating layer on an entire surface; bonding a second substrate to the second insulating layer; performing a thermal process so that the impurities diffuse into the polysilicon layer and the silicon single crystal layer, so that a collector region which is a part of the silicon single crystal region, and a collector lead region surrounding the collector region and having a concentration higher than that of the collector region are formed; polishing the first substrate so that the collector region and the collector lead region appear; forming a collector electrode on the collector lead region; forming a base region on the collector region; forming an emitter region in the base region; and forming base and emitter electrodes connected to the base region and the emitter region, respectively.

The above-mentioned object of the present invention is also achieved by a method of producing a bipolar transistor comprising the steps of: forming a first insulating layer on a first substrate; forming an opening in the first insulating layer; partially forming a second insulating layer on the first substrate via the opening; epitaxially growing silicon so that a silicon single crystal layer is formed on the first substrate and a polysilicon layer is formed on the first and second insulating layers; introducing impurities into surface portions of the polysilicon layer and the silicon single crystal layer; forming a third insulating layer on an entire surface; bonding a second substrate to the third insulating layer layer; performing a thermal process so that the impurities diffuse into the polysilicon layer and the silicon single crystal layer, so that a collector region which is a part of the silicon single crystal region, and a collector lead region surrounding the collector region and having a concentration higher than that of the collector region are formed; polishing the first substrate so that the second insulating layer appears; forming a contact window in the second insulating layer; forming a collector electrode on the collector lead region though the contact window; forming a base region on the collector region; forming an emitter region in the base region; and forming base and emitter electrodes connected to the base region and the emitter region, respectively.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

Figure 1:
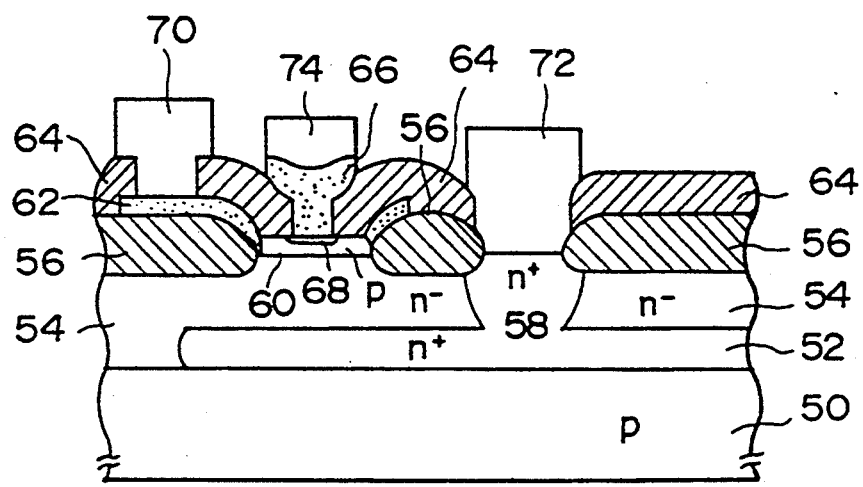
FIG. 1 is a cross-sectional view of a conventional bipolar transistor.
Figure 2A:
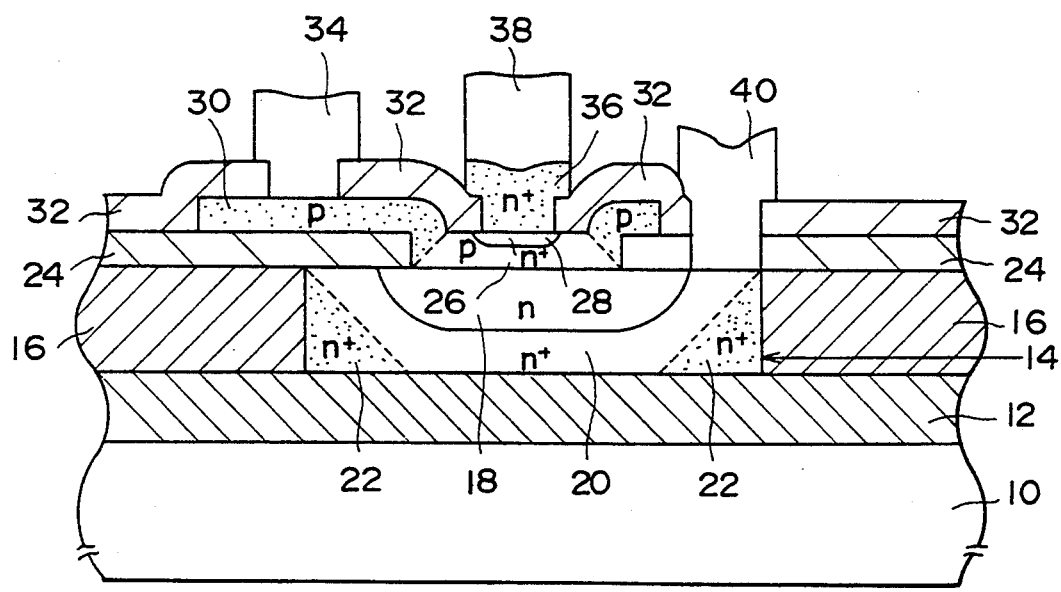
FIG. 2A is a cross-sectional view of a first embodiment of the present invention.

FIG. 2A is a cross-sectional view of a bipolar transistor according to a first embodiment of the present invention. A silicon oxide film 12 having a thickness of 1 $\mu$m is formed on a silicon substrate 10. A semiconductor layer 14 is formed to a thickness of 600 nm on the silicon oxide film 12. The semiconductor layer 14 has side surfaces surrounded by a silicon oxide film 16 formed on the silicon oxide film 12.

An n-type collector region 18 is formed in a surface portion of the semiconductor layer 14. The collector region 18 has side surfaces surrounded by an n$^+$-type collector lead region 20. The semiconductor layer 14 has a polysilicon layer 22 formed along edge portions of the semiconductor layer 14 which are in contact with the silicon oxide film 12.

Figure 2B:
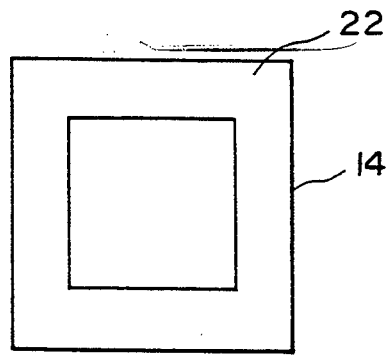
FIG. 2B is a plan view of a semiconductor layer shown in FIG. 2A.

FIG. 2B is a plan view of the semiconductor layer 14. As shown in FIG. 2B, the semiconductor layer 14 has, for example, a rectangular surface and the edge portions of the semiconductor layer which are in contact with the silicon oxide film 12 are formed of the polysilicon layer 22. A portion of the semiconductor layer 14, other than the polysilicon layer 22, is made of a silicon single crystal.

As shown in FIG. 2A, a p-type base region 26 is formed on the n-type collector region 18 via an opening formed in a silicon oxide film 24. An n$^+$-type emitter region 28 is formed in a surface portion of the p-type base region 26. A p-type base lead region 30, which is connected to the p-type base region 26, is connected to an Al base electrode 34 via a contact window formed in a silicon oxide film 32. The n-type emitter region 28 is connected, via a contact window formed in the silicon oxide film 32, to an n$^+$-type emitter lead electrode 36 formed of polysilicon. The n$^+$-type emitter lead electrode 36 is connected to an Al emitter electrode 38 formed thereon. A collector electrode 40 is formed on the n$^+$-type collector lead electrode 20 via a contact window formed in the silicon oxide films 24 and 32.

Figure 3A:
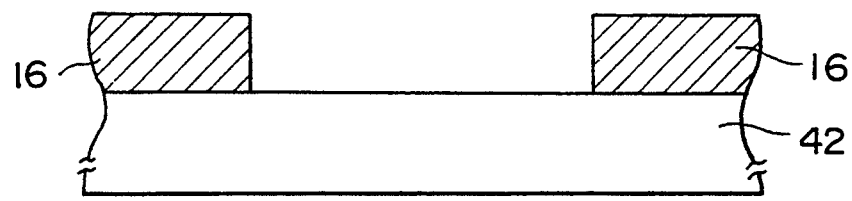
FIGS. 3A through 3G are cross-sectional views showing a process for producing the first embodiment of the present invention.

A description will now be given, with reference to FIGS. 3A through 3G, of a method of producing the first embodiment of the present invention. As shown in FIG. 3A, the silicon oxide film 16 having a thickness of 600 nm is formed on a silicon substrate 42 by a thermal oxidation process. Next, the silicon oxide film 16 is selectively etched by using a mask patterned into a predetermined shape by a photolithography process, so that the surface of the silicon substrate 42 is partially exposed.

Figure 3B:
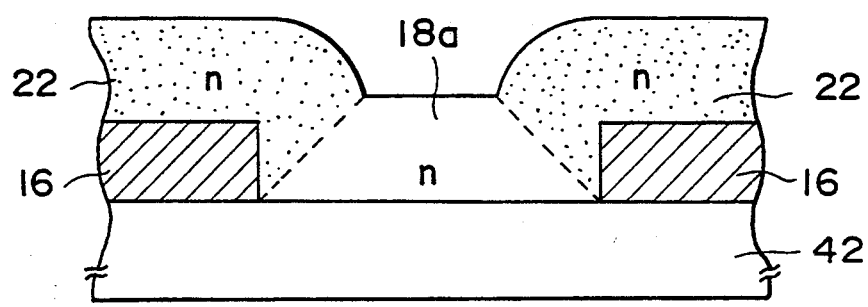

As shown in FIG. 3B, silicon is epitaxially grown on the entire surface. Thereby, an n-type silicon single crystal layer 18a is epitaxially grown to a thickness of 700 nm on an exposed surface of the silicon substrate 42 at 800° C.–900° C. by an epitaxial process. At the same time as the silicon single crystal layer 18a is formed, the n-type polysilicon layer 22 having a thickness of 700 nm is formed on the side and upper surfaces of the silicon oxide film 16. The silicon single crystal layer 18a and the polysilicon layer 22 are connected to each other at an interface depicted by broken lines shown in FIG. 3B.

As shown in FIG. 3B, the polysilicon layer 22 and the silicon single crystal layer 18a are selectively polished by using a predetermined polishing agent containing an alkaline-system solution. The polishing is continuously carried out until the upper surface of the silicon oxide film 16 which functions as a stopper appears. In this manner, the semiconductor layer 14 having the side surfaces thereof surrounded by the silicon oxide film 16 is formed on the semiconductor substrate 42.

Figure 3C:
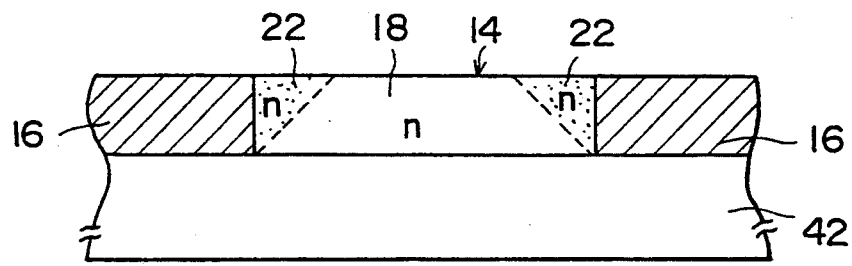

As shown in FIG. 3C, As is doped into the surface of the semiconductor layer 14 at a dose of 1E16 cm$^{-2}$ by an ion implantation process. Thereby, an n$^+$-type impurity region 20a having a concentration of 1E20 cm$^{-3}$ is formed in a surface portion of the semiconductor layer 14. P can be used instead of As.

Figure 3D:
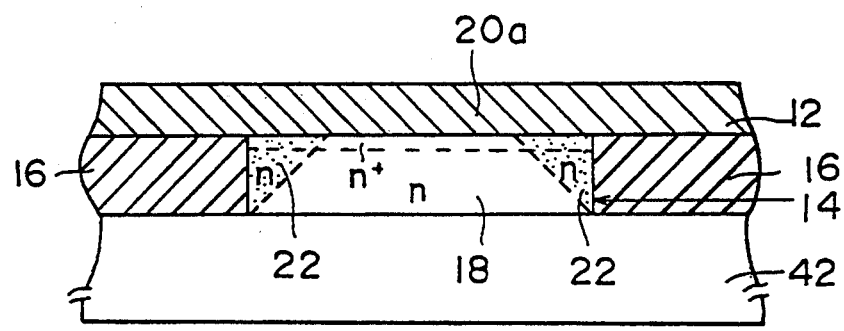

Subsequently, as shown in FIG. 3D, the silicon oxide film 12 is deposited to a thickness of 1 $\mu$m on the semiconductor layer 14 and the silicon oxide film 16. The silicon oxide film 12 can be formed by a CVD (Chemical Vepor Deposition) process. It is also possible to replace a BPSG (Boro-Phospho-Silicate Glass) layer with the CVD silicon oxide film 12. It is preferable to form a composite film consisting of a silicon oxide film on the silicon substrate 42 and the BPSG layer on the silicon oxide film.

Figure 3E:
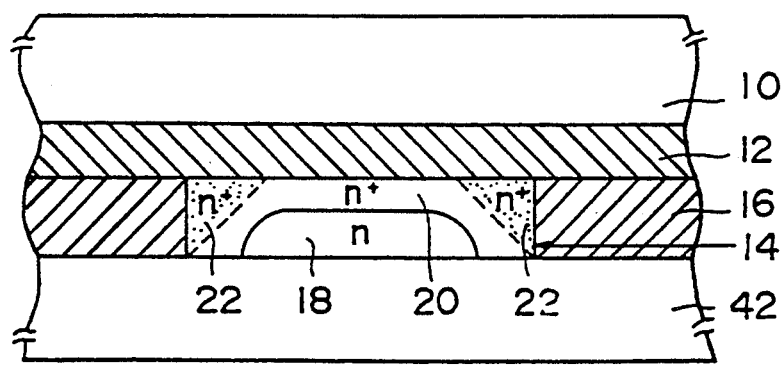

As shown in FIG. 3E, the silicon substrate 10 is bonded to the silicon oxide film 12, which functions to prevent any nonuniform stress from being exerted on the bonding interface. The bonding process is carried out at a temperature of about 900° C. Due to this heat treatment, As ions contained in the n+-type impurity region 20a are activated and diffused into the semiconductor layer 14. It is possible to control the diffusion process by controlling the heat treatment, for example, by controlling the time it takes to diffuse impurities. The diffusion coefficient of As in the polysilicon layer 22 is greater than that of As in the silicon single crystal layer 18a. Hence, As ions diffuse into the polysilicon layer 22 at a speed higher than the speed at which As ions diffuse into the silicon single crystal layer 18, and reach an interface between the semiconductor layer 14 and the silicon substrate 42.

In this manner, the n+-type collector lead region 20 having a high concentration and the n-type collector region 18 are formed in the semiconductor layer 14. The collector region 18 is the remaining silicon single crystal region of the semiconductor layer 14 covered by the n+-type collector lead region 20. The n+-type collector lead region 20 is partially in contact with the silicon substrate 42.

Figure 3F:
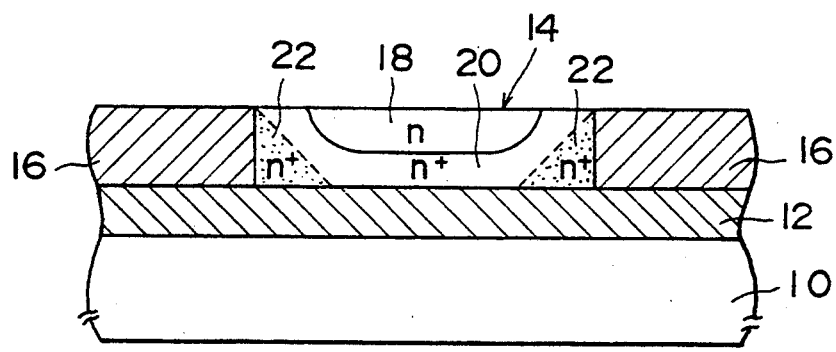

As shown in FIG. 3F, a back surface of the silicon substrate 42 is ground and polished. This process is carried out until the bottom surface of the silicon oxide film 16, which functions as a stopper, appears. By this process, the n-type collector region 18 and the n+-type collector lead region 20 are exposed. Then, the device is turned upside down.

Figure 3G:
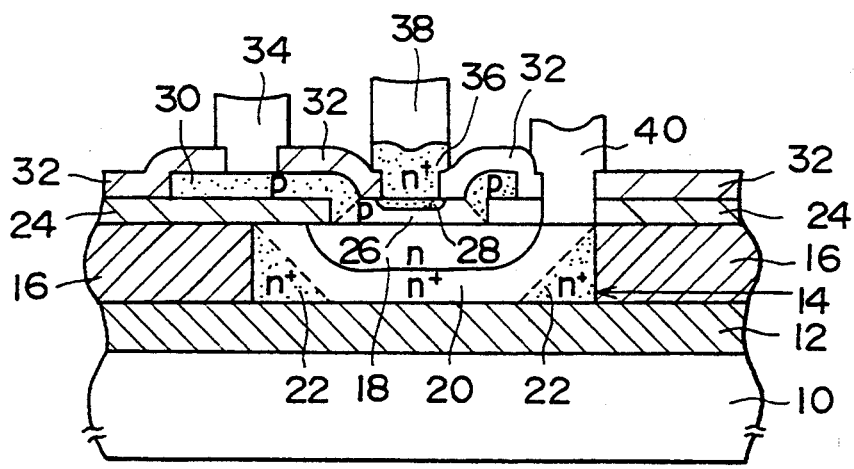

As shown in FIG. 3G, other layers necessary to form a bipolar transistor are formed in the following manner. The silicon oxide film 24 is formed on the semiconductor layer 14 and the silicon oxide film 16. After this, the opening for the formation of the emitter electrode 38 is formed in the silicon oxide film 24 so that it is located above the semiconductor layer 14. Thereby, a part of the surface of the n-type collector region 18 appears through the opening. Subsequently, the p-type silicon layer is epitaxially grown on the entire surface, and patterned in a predetermined shape. By this process, the p-type base layer 26 made of silicon single crystal is formed on the n-type collector region 18, and the p-type base lead region 30 made of polysilicon is formed on the silicon oxide film 24. The p-type base region 26 and the p-type base lead region 30 are connected to each other via an interface depicted by broken lines.

The silicon oxide film 32 is formed on the entire surface, and the contact window is formed in the silicon oxide film 32 so that it is located above the p-type base region 26. Then, an n+-type polysilicon layer is deposited on the entire surface. Then, n+-type impurities, derived from the n+-type polysilicon layer, diffuse into the p-type base region 26 so that the n+-type emitter region 28 is formed in the p-type base region 26. A portion of the n+-type polysilicon layer is patterned into a predetermined shape, and thereby the n+-type emitter lead electrode 36 is formed.

A contact window positioned above the p-type base lead region 30 is formed in the silicon oxide film 32, and a contact window positioned above the n+-type collector lead region 20 is formed in the silicon oxide film 24 and the silicon oxide film 32. Subsequently, an Al layer is deposited on the entire surface and then patterned into a predetermined shape. In this manner, the base electrode 34 connected to the p-type base lead region 30, the emitter electrode 38 connected to the emitter lead electrode 36 and the collector electrode 40 connected to the collector lead region 20 are formed, as shown in FIG. 3G. In the above-mentioned manner, the epitaxial-base silicon bipolar transistor is formed.

In the first embodiment of the present invention, the silicon oxide films 12 and 16 having sufficient thicknesses are formed on the bottom and side surfaces of the n+-type collector lead region 20. With this arrangement, it becomes possible to extremely reduce the parasitic capacitance formed between the collector and the substrate. The experimental results of the inventors show that the parasitic capacitance can be reduced by about 10% and the transistor operation is faster than the conventional operation by about 10%.

It should be noted that the n+-type collector lead electrode 20 can be formed by carrying out the impurity diffusion process one time. Thus, the production process of the present invention is simpler than the conventional process in which the diffusion process is carried out twice.

Figure 4:
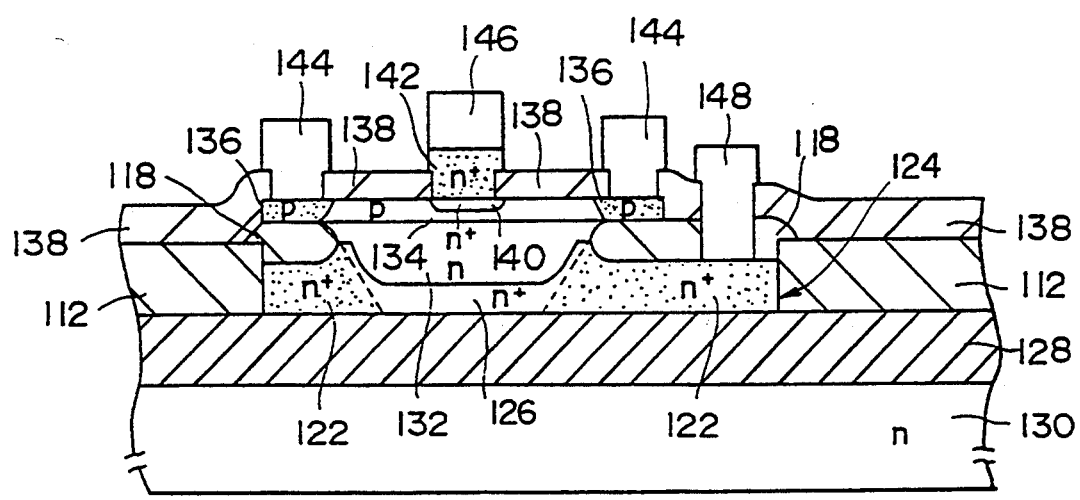
FIG. 4 is a cross-sectional view of a second embodiment of the present invention.

A description will now be given of a second embodiment of the present invention with reference to FIG. 4, which is a cross-sectional view of the second embodiment of the present invention. A silicon oxide film 128 having a thickness of 1 μm is formed on an n-type silicon substrate 130, which functions as a supporting base. A semiconductor layer 124 is formed on the silicon oxide film 128, and has side surfaces surrounded by silicon oxide film 112. Further, an upper surface of the semiconductor layer 124 is partially covered by a silicon oxide film 118. An n-type collector region 132 is formed in a surface portion of the semiconductor layer 124, and covers an n+-type collector lead region 126. As shown in FIG. 4, the n+-type collector is composed of a silicon single crystal layer 126 which is a lower part of the semiconductor layer 124, and a polysilicon layer 122 surrounding side surfaces of the silicon single crystal layer 126. The semiconductor layer 120 thus includes the layers 122, 126 and 132.

A p-type base region 134 is formed on the n-type collector region 132. An n+-type emitter region 140 is formed in a surface portion of the p-type base region 134. A p-type base lead electrode 136, which is in contact with the p-type base region 134, is connected to Al base electrodes 144 via contact windows formed in a silicon oxide film 138. The n+-type emitter region 140 is connected, through a contact window formed in the silicon oxide film 138, to an n+-type lead electrode 142 made of polysilicon. An emitter electrode 146 of Al is formed on the n+-type emitter lead electrode 142. A collector electrode 148 is formed on the n+-type collector lead region 126 via a contact window formed in the silicon oxide films 118 and 138.

Figure 5A:
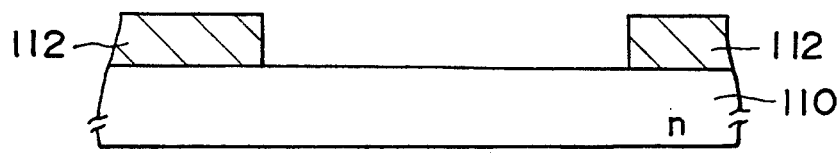
FIGS. 5A through 5J are cross-sectional views of a process for producing the second embodiment of the present invention.

A description will now be given, with reference to FIGS. 5A through 5J, of a process of producing the bipolar transistor shown in FIG. 4. As shown in FIG. 5A, the silicon oxide film 112 having a thickness of 600 nm is formed on an n-type silicon substrate 110 by a thermal oxidation process, and then selectively etched by using a patterned mask into a predetermined shape by a photolithography process. Thereby, a portion of the surface of the n-type silicon substrate 110 is exposed.

Figure 5B:
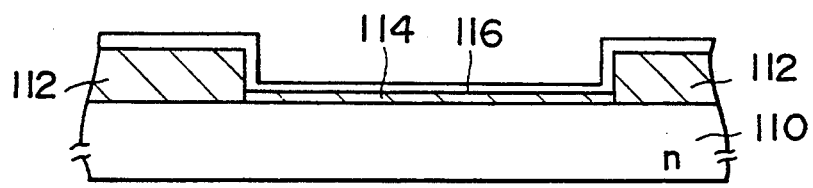

As shown in FIG. 5B, a pad oxide film 114 having a thickness of 30 nm is formed on the exposed surface of the n-type silicon substrate 110. Then, a silicon nitride film 116 is formed to a thickness of 100 nm on the entire surface.

Figure 5C:
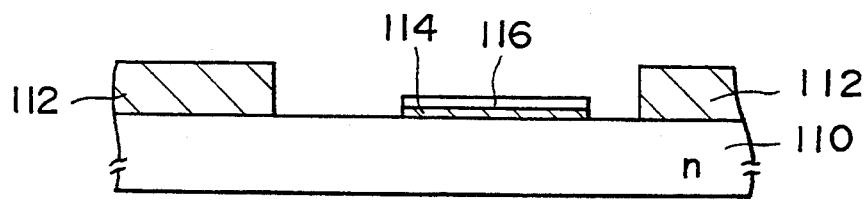

As shown in FIG. 5C, the silicon nitride film 116 and the pad oxide film 114 are patterned into a predetermined shape by a photolithography process, so that the patterned silicon nitride film 116 and patterned oxide film 114 are formed on the surface of the n-type silicon substrate 110. In the structure shown in FIG. 5C, the patterned films 114 and 116 have edges closer to a right-side inner wall of the silicon oxide film 112 than are the opposite edges thereof to a left-side inner wall thereof and thus is off-centered, leaving a wider space on one side (i.e., the left side). This off-centered location is because the collector electrode 148, as shown in FIG. 4, is to be formed in the wider space, shown on the left side of the patterned films 14 and 16 in FIG. 4 (and thus the reverse of FIG. 5C).

Figure 5D:
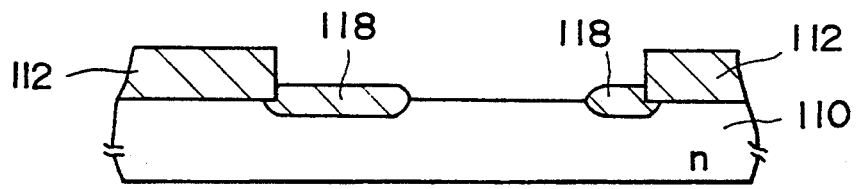
Figure 6:
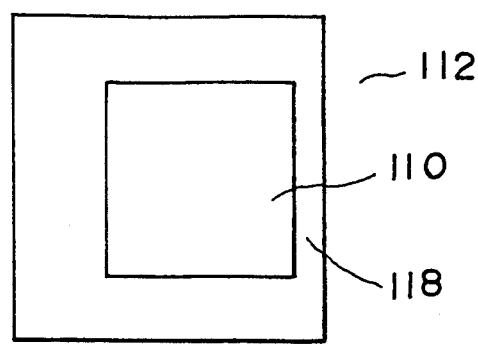
FIG. 6 is a plan view of a semiconductor layer shown in FIG. 4.

As shown in FIG. 5D, a selective oxidation process using the patterned silicon nitride film 16 as a mask is carried out, whereby the silicon oxide film 118 having a thickness of 600 nm is formed on a surface area of the silicon substrate 110. Thereafter, the silicon nitride film 116 and the pad oxide film 114 are removed, so that the surface of the silicon substrate 110 appears, as shown in FIG. 5D. FIG. 6 is a plan view of the structure shown in FIG. 5D.

Figure 5E:
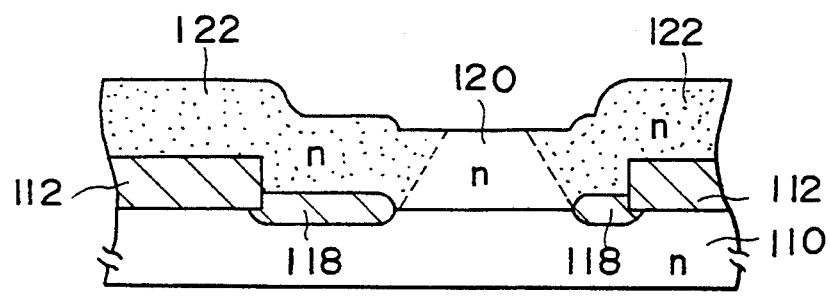

As shown in FIG. 5E, silicon is epitaxially grown on the entire surface. Thereby, a silicon single crystal layer 120 is epitaxially grown to 700 nm on the exposed surface of the n-type silicon substrate 110 at 800°–900° C. Simultaneously, an n-type polysilicon layer 122 is formed on the silicon oxide films 112 and 118. The silicon single crystal layer 120 and the polysilicon layer 122 are connected to each other at an interface depicted by broken lines shown in FIG. 5E.

Figure 5F:
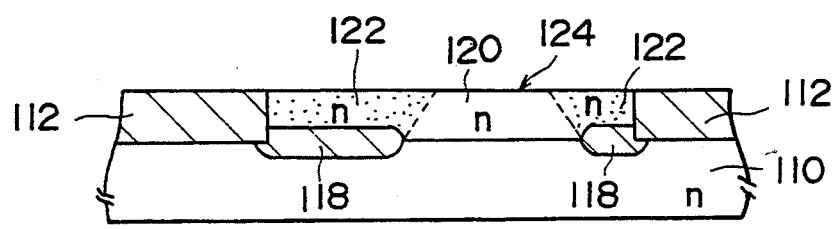

As shown in FIG. 5F, the polysilicon layer 122 and the silicon single crystal layer 120 are selectively polished by using a predetermined polishing agent containing an alkaline-system solution. The polishing is continuously carried out until the upper surface of the silicon oxide film 112, which functions as a stopper, appears. In this manner, the semiconductor layer 124 having the opposite side surfaces thereof surrounded by the silicon oxide film 112 and having the upper subsequently (lower) surface covered by the silicon oxide film 118 is formed on the semiconductor substrate 110. A semiconductor layer 124 includes the silicon single crystal layer 120 formed on the n-type silicon substrate 110 and the polysilicon layer 122 formed on the silicon oxide film 118. It is possible to perform the polishing process after forming an oxide film on the layers 120 and 122.

Figure 5G:
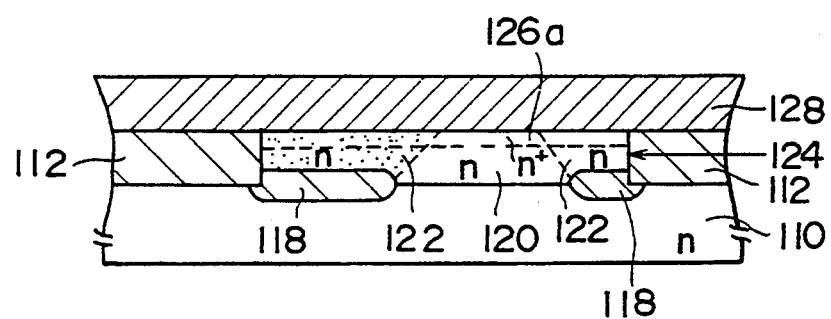

As shown in FIG. 5G, As is doped into the surface of the semiconductor layer 124 at a dose of $1E16$ cm$^{-2}$ by an ion implantation process. Thereby, an n$^+$-type impurity region 126a having a concentration of $1E20$ cm$^{-3}$ is formed in a surface portion of the semiconductor layer 124 and the silicon oxide film 112.

Subsequently, as shown in FIG. 5G, the silicon oxide film 128 is deposited to a thickness of 1 μm on the semiconductor layer 124 and the silicon oxide film 112. The silicon oxide film 112 can be formed by a CVD (Chemical Vepor Deposition) process. It is also possible to replace a BPSG (Boro-Phospho-Silicate Glass) layer with the CVD silicon oxide film 112. It is preferable to form a composite film consisting of a silicon oxide film on the silicon substrate 110 and the BPSG layer on the silicon oxide film.

As shown in FIG. 5G, the silicon substrate 130 is bonded to the silicon oxide film 128, which functions to prevent any nonuniform stress from being exerted on the bonding interface. The bonding process is carried out at a temperature of about 900° C. Due to this heat treatment, As ions contained in the n$^+$-type impurity region 126a are activated and diffused into the semiconductor layer 124. The diffusion coefficient of As in the polysilicon layer 122 is greater than that of As in the silicon single crystal layer 120. Hence, As ions diffuse into the polysilicon layer 122 at a speed higher than a speed at which As ions diffuse into the silicon single crystal layer 120, and reach an interface between the semiconductor layer 124 and the silicon oxide film 118.

Figure 5H:
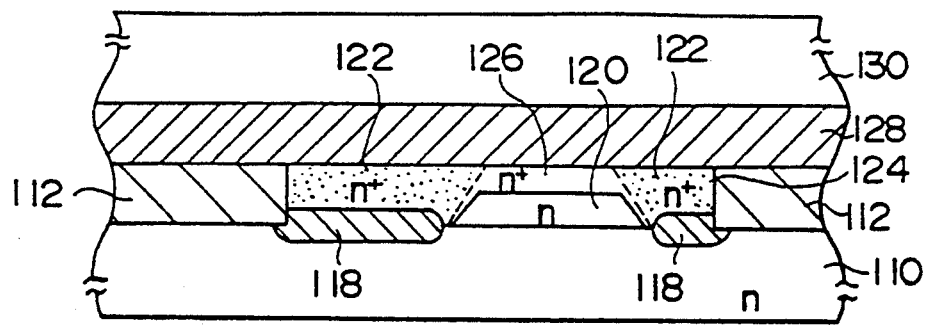

In this manner, as shown in FIG. 5H, the n$^+$-type collector lead region 126 having a high concentration and the n-type collector region 120 are formed in the semiconductor layer 124. The collector region 120 is the remaining silicon single crystal region of the semiconductor layer 124 covered by the n$^+$-type collector lead region 126.

Figure 5I:
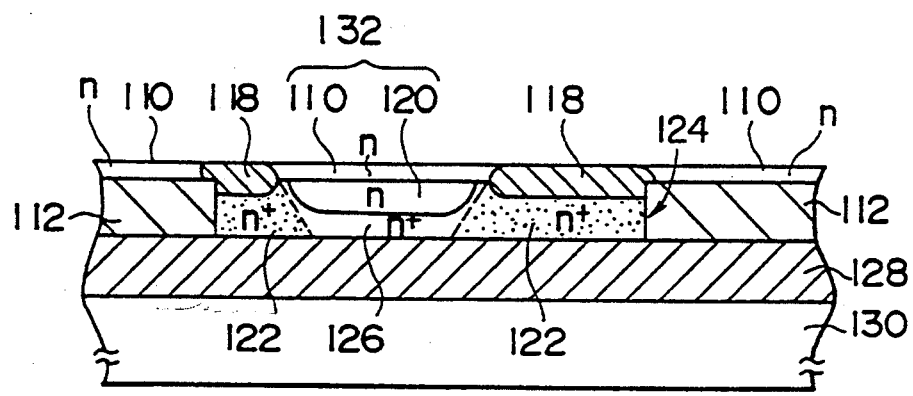

As shown in FIG. 5I, a back surface of the silicon substrate 110 is ground and polished. This process is carried out until the bottom surface of the silicon oxide film 118, which functions as a stopper, appears. By this process, a part of the n-type silicon substrate 110 is left on the n-type silicon single crystal layer 120. The above part of the n-type silicon substrate 110 and the n-type silicon layer 120 form the n-type collector region 132. Then, the device is turned upside down.

Figure 5J:
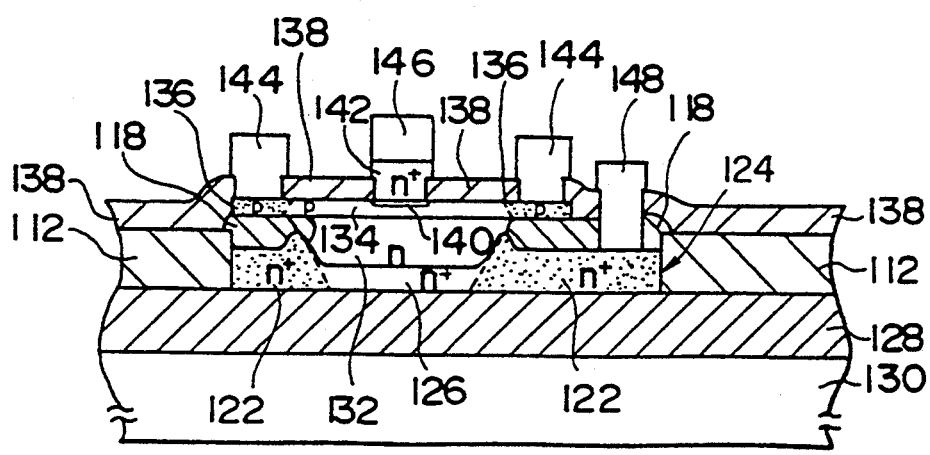

As shown in FIG. 5J, other layers necessary to form a bipolar transistor are formed in the following manner. A p-type silicon layer is epitaxially grown on the entire surface, and then patterned into a predetermined shape. During this process, the part of the n-type silicon substrate 110 left on the silicon oxide film 112 is removed. In this manner, the p-type base region 134 made of silicon single crystal is formed on the n-type collector region 132, and the p-type base lead region 136 made of polysilicon is formed on the silicon oxide film 118. The p-type base region 134 and the p-type base lead region 136 are connected to each other at an interface depicted by broken lines shown in FIG. 5J.

A silicon oxide film 138 is formed on the entire surface, and a contact window located above the p-type base region 134 is formed in the silicon oxide film 138. Then, an n$^+$-type polysilicon layer is deposited on the entire surface. After this, the n$^+$-type emitter region 140 is formed in a surface portion of the p-type base region 134 by diffusing impurities from the n$^+$-type polysilicon layer, and then pattered into a predetermined shape. In this manner, the n$^+$-type emitter lead electrode 142 is formed.

Contact windows are formed in the silicon oxide film 138 so that they are located above the p-type base lead region 136. Further, a contact window is formed in the silicon oxide films 118 and 138 so that a part of the surface of the n$^+$-type polysilicon layer 122 is exposed. Subsequently, an Al layer is deposited on the entire surface, and then patterned into a desired shape. In this manner, as shown in FIG. 5J, the base electrode 144 connected to the p-type base lead electrode 136, the emitter electrode 146 connected to the emitter lead electrode 142, and the collector electrode 148 connected to the n$^+$-type collector lead region 126 are formed.

The second embodiment of the present invention has the same advantages as those of the first embodiment of the present invention. Further, it is easy to position the contact window for the formation of the collector electrode, as compared with the first embodiment of the present invention. Moreover, the base region 134 shown in FIG. 4 is longer than the base region 26 shown in FIG. 2A.

Figure 7A:
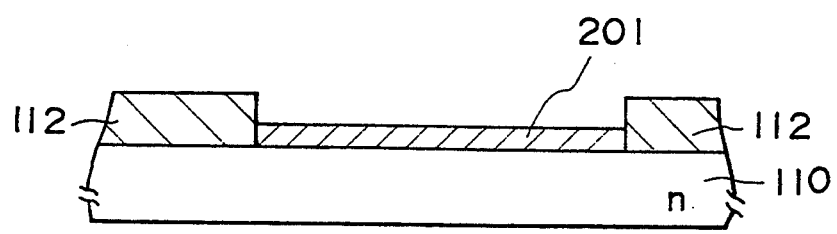
FIGS. 7A and 7B are cross-sectional views showing an alternative process of producing the second embodiment of the present invention.
Figure 7B:
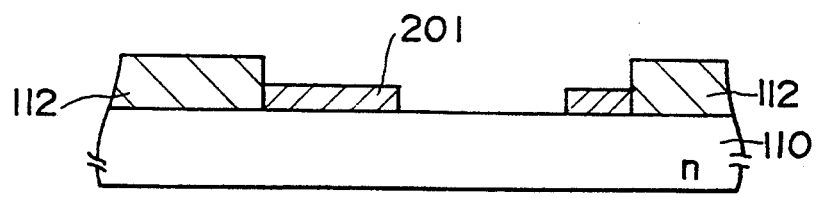

FIGS. 7A and 7B show a variation of the production process of the second embodiment of the present invention. Production steps shown in FIGS. 7A and 7B are substituted for those shown in FIGS. 5A through 5D. As shown in FIG. 7A, a silicon oxide film 201 is formed on the entire surface of the structure shown in FIG. 5A. After this, as shown in FIG. 7B, an opening window is formed in the silicon oxide film 201.

The present invention is not limited to the specifically disclosed embodiments. The present invention includes all devices having the collector structure as has been described previously. For example, the present invention includes a normal bipolar transistor in which a base region is formed on the surface of the n-type collector region 132 by a diffusion process. It is possible to use a p-type silicon substrate. In this case, the conductivity of each layer is different from that in the structure shown in FIG. 2A or FIG. 4.

What is claimed is:

1. A bipolar transistor comprising:
   a substrate;
   an insulating layer formed on the substrate;
   a semiconductor layer having a bottom surface and peripheral side surface directly in contact with said insulating layer, said semiconductor layer comprising:
   a collector region, comprising a silicon single crystal, formed in a first surface portion of said semiconductor layer and having a side surface,
   a collector lead region, comprising a silicon single crystal, formed in a second surface portion of said semiconductor layer and having an impurity concentration higher than that of said collector region, said collector lead region having an inner side surface directly in contact with, and surrounding, the outer side surface of the collector region and having an outer side surface,
   a polysilicon layer having an inner side surface directly in contact with, and in surrounding relationship with respect to, said outer side surface of said collector lead region, and
   said collector lead region and said polysilicon layer being formed on and directly in contact with said insulating layer and separated by said insulating layer from said substrate;
   a base region formed on said collector region at said second surface portion of said semiconductor layer; and
   an emitter region formed in said base region.

2. A bipolar transistor as claimed in claim 1, wherein said bipolar transistor further comprises a collector electrode connected to said collector lead region.

3. A bipolar transistor as claimed in claim 1, wherein said polysilicon layer extends from the surrounding relationship with respect to said collector lead region to, and defines, the peripheral side surface of the semiconductor layer in contact with said insulating layer and has a substantially triangular cross section between the inner side surface thereof, the surface of the insulating layer and the peripheral side surface.

4. A bipolar transistor as claimed in claim 1, wherein:
   said insulating layer has an insulating layer portion thereof formed on the polysilicon layer of said semiconductor layer;
   a contact window is formed in said insulating layer portion; and
   said collector electrode is in contact with said polysilicon layer through said contact window.

5. A bipolar transistor as claimed in claim 4, wherein:
   said base region has a main surface;
   said bipolar transistor further comprises a base lead region formed on said insulating layer portion and connected to said base region;
   a main surface of said base lead region is located at a layer level identical to that of said main surface of said base region; and
   a base electrode is connected to said base lead region.

6. A bipolar transistor as claimed in claim 5, wherein said base lead region is located above said polysilicon layer.

7. A bipolar transistor as claimed in claim 1, wherein said collector region has a main surface and said base region is located on the entirety of said main surface of said collector region of said semiconductor layer.

8. A bipolar transistor as claimed in claim 1, wherein said polysilicon layer extends from the surrounding relationship with respect to said collector lead region to, and defines, the peripheral side surface of the semiconductor layer.

9. A bipolar transistor as claimed in claim 1, wherein said substrate comprises silicon.

10. A bipolar transistor comprising:
    a substrate having a main surface;
    a first insulating layer having upper and lower main surfaces and formed, at the lower main surface thereof, on the main surface of the substrate, the first insulating layer having a recess therein defined by a recessed surface parallel to and displaced from the lower main surface of the insulating layer and a sidewall defining the periphery of the recess and extending substantially perpendicularly from the recessed surface portion to the upper main surface of the first insulating layer;
    a semiconductor layer formed in the recess and having a top main surface, a bottom main surface formed on and directly in contact with the recessed surface of the recess and a side surface surrounded by and directly in contact with the sidewall, the semiconductor layer comprising a single crystal portion and a polysilicon portion surrounding the single crystal portion at an interface therebetween, the single crystal portion comprising a first portion defining a collector region extending into the single crystal portion from a central surface portion of the top main surface of the semiconductor layer and a second portion, defining a first portion of a collector lead region, having an impurity concentration higher than that of the collector region and extending into the single crystal portion from a central surface portion of the bottom main surface of the semiconductor layer into contact with, and in surrounding relationship with respect to, the collector region, the polysilicon portion defining a second portion of the collector lead region and extending outwardly from the central surface portion of the bottom main surface of the semiconductor layer and along, and on, the recessed surface of the recess in the first insulating layer to the periphery of the recess and along, and on, the sidewall of the recess and toward the top main surface of the semiconductor layer and into surrounding relationship with respect to the single crystal portion and defining an interface therewith;

a base region having a lower main surface, formed on the central surface portion of the top main surface of said semiconductor layer and thus on the collector region, and an upper main surface; and an emitter region formed on the upper main surface of the base region and extending into said base region.

11. A bipolar transistor as recited in claim 10, wherein the second portion of the silicon single crystal, defining a first portion of the collector lead region, extends to, and has a surface exposed in a common plane with, the top main surface of the semiconductor layer.

12. A bipolar transistor as recited in claim 11, further comprising a collector electrode connected to the exposed surface of the second portion of the silicon single crystal portion.

13. A bipolar transistor as recited in claim 12, wherein the polysilicon portion has a substantially triangular cross-section, in a plane transverse to the upper and lower main surfaces of the semiconductor layer and extending outwardly from the interface thereof with the silicon single crystal portion and to the peripheral sidewall of the recess in the insulating layer.

14. A bipolar transistor as recited in claim 11, further comprising:
a second insulating layer formed on, and extending along, the upper main surface of the first insulating layer, the exposed surface of the second portion of the silicon single crystal portion and a peripheral surface portion of the collector region;
a contact window formed in and extending through the second insulating layer and exposing therethrough the exposed surface of the second portion of the silicon single crystal portion; and
a collector electrode extending through the contact window and into contact with the exposed surface of the second portion of the silicon single crystal portion.

15. A bipolar transistor as recited in claim 14, wherein:
the base region has a peripheral sidewall; and
the second insulating layer extends along the peripheral surface portion of the collector region to, and into contact with, the base region peripheral sidewall, at least at the lower main surface of the base region.

16. A bipolar transistor as recited in claim 15, wherein:
the base region peripheral sidewall, in a portion thereof extending from the upper main surface of the base region, is displaced from the second insulating layer and thereby is exposed and defines a gap therebetween; and
a base lead region is formed on and extends along said second insulating layer, into the gap and into contact with the exposed portion of the base region peripheral sidewall.

17. A bipolar transistor as recited in claim 16, wherein the second insulating layer separates the base lead region from the top main surface of the semiconductor layer and thereby from the peripheral portion of the collector region.

18. A bipolar transistor as recited in claim 10, wherein the thickness of the semiconductor layer is the same as the thickness of the first insulating layer and, accordingly, the top main surface of the semiconductor layer is in a common plane with the top main surface of the first insulating layer.

19. A bipolar transistor as recited in claim 10, wherein the interface extends from the central surface portion of the bottom surface in a direction toward the top main surface of the semiconductor layer and angularly outwardly toward the peripheral sidewall of the recess.

20. A bipolar transistor as recited in claim 19, wherein the semiconductor layer is of the same thickness as the insulating layer and the interface extends from the central surface portion of the bottom surface of the semiconductor layer to the juncture of the peripheral sidewall of the recess and the upper main surface of the insulating layer.

21. A bipolar transistor as recited in claim 10, wherein the top main surface of the semiconductor layer further comprises a peripheral surface portion surrounding the central surface portion and of reduced height, relative to the height of the central surface portion, from the upper main surface of the insulating layer, the polysilicon portion extending to, and being exposed at and defining, the peripheral surface portion of the top main surface of the semiconductor layer.

22. A bipolar transistor as recited in claim 21, further comprising:
a second insulating layer having a lower surface disposed on and covering the peripheral surface portion of the top main surface of the semiconductor layer and extending from the peripheral sidewall of the recess and into surrounding relationship with respect to, and contacting, the central surface portion of the top main surface of the semiconductor layer.

23. A bipolar transistor as recited in claim 22, wherein the central surface portion and the top surface of the second insulating layer lie in a common plane.

24. A bipolar transistor as recited in claim 23, wherein:
the base region covers the central surface portion of the top main surface of the semiconductor layer and has a sidewall at the common peripheries of the base region and the central surface portion of the top main surface of the semiconductor layer; and
a base lead region is formed on and extends along the second insulating layer and into contact with the peripheral sidewall of the base region.

25. A bipolar transistor as recited in claim 24, wherein:
the base region and the base lead region have a common upper main surface;
a third insulating layer is formed on the common upper main surface of the base region and the base lead region;
a window is formed in the third insulating layer, exposing therethrough a portion of the upper main surface of the base lead region; and
a base electrode extends through the window and contacts the exposed portion of the upper main surface of the base lead region.

26. A bipolar transistor as recited in claim 25, further comprising:
an emitter region formed in the base region from the upper main surface thereof;
a further window in the third insulating layer, exposing therethrough a surface portion of the emitter region; and
an emitter electrode extending through the further window and contacting the exposed surface portion of the emitter region.

* * * * *

UNITED STATES PATENT AND TRADEMARK OFFICE
CERTIFICATE OF CORRECTION

PATENT NO.  : 5,406,113
DATED       : April 11, 1995
INVENTOR(S) : HORIE

It is certified that error appears in the above-indentified patent and that said Letters Patent is hereby corrected as shown below:

Col. 6,  line 34, change "126." to --which, as--;
         line 35, delete "As"; and delete "the n⁺-type collector".

Col. 7,  line 42, delete "subsequently";
         line 43, change "(lower)" to --(subsequently lower)--.

Signed and Sealed this

Thirty-first Day of October 1995

Attest:

BRUCE LEHMAN

*Attesting Officer*    *Commissioner of Patents and Trademarks*